United States Patent
Searles et al.

(10) Patent No.: US 7,929,361 B2
(45) Date of Patent: Apr. 19, 2011

(54) CIRCUIT USING A SHARED DELAY LOCKED LOOP (DLL) AND METHOD THEREFOR

(75) Inventors: Shawn Searles, Austin, TX (US); Faisal A. Syed, Austin, TX (US); Nicholas T. Humphries, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 308 days.

(21) Appl. No.: 12/059,613

(22) Filed: Mar. 31, 2008

(65) Prior Publication Data

US 2009/0244996 A1   Oct. 1, 2009

(51) Int. Cl.
*G11C 7/00* (2006.01)

(52) U.S. Cl. ...... 365/194; 365/193; 365/233.1; 365/233.19; 713/400; 713/401

(58) Field of Classification Search ......... 365/193, 365/194, 233.1, 233.19; 713/400, 401, 501–503, 713/600–601
See application file for complete search history.

(56) References Cited

U.S. PATENT DOCUMENTS

| | | | |
|---|---|---|---|
| 5,373,255 A | 12/1994 | Bray et al. | |
| 5,440,515 A | 8/1995 | Chang et al. | |
| 5,857,095 A | 1/1999 | Jeddeloh et al. | |
| 6,691,214 B1 | 2/2004 | Li et al. | |
| 6,791,889 B2 | 9/2004 | Peterson | |
| 6,930,932 B2 | 8/2005 | Rentschler | |
| 7,038,971 B2 | 5/2006 | Chung | |
| 7,061,941 B1 | 6/2006 | Zheng | |
| 7,117,381 B2 * | 10/2006 | Kim et al. ............ 713/400 |
| 7,184,323 B2 | 2/2007 | Fujisawa | |
| 7,321,525 B2 | 1/2008 | Matsui | |
| 7,457,174 B2 | 11/2008 | Braun et al. | |
| 7,487,378 B2 | 2/2009 | Morein et al. | |
| 7,518,946 B2 * | 4/2009 | Iwasaki ............ 365/233.1 |
| 2002/0147892 A1 | 10/2002 | Rentschler et al. | |
| 2002/0147896 A1 | 10/2002 | Rentschler et al. | |
| 2003/0021164 A1 | 1/2003 | Yoo et al. | |
| 2004/0143775 A1 | 7/2004 | Li et al. | |
| 2005/0197082 A1 | 9/2005 | Agostinelli | |

(Continued)

FOREIGN PATENT DOCUMENTS

WO   2008/063199 A1   5/2008

OTHER PUBLICATIONS

International Search Report in application No. PCT/US2009/003220 mailed Sep. 15, 2009, 12 pages.

(Continued)

*Primary Examiner* — Van Thu Nguyen (57) ABSTRACT

A transceiver (222) includes a receive circuit (320), a transmit circuit (340), a shared delay locked loop (DLL) (360), and a controller (210). The receive circuit (320) has a first input coupled to an external data terminal, a second input coupled to an external data strobe terminal, and an output coupled to an internal data terminal. The transmit circuit (340) has a first input coupled to the internal data terminal, a second input for receiving an internal clock signal, a first output coupled to the external data terminal, and a second output coupled to the external data strobe terminal. The controller (210) enables the shared DLL (360) for use by the receive circuit (320) during a receive cycle, and enables the shared DLL (360) for use by the transmit circuit (340) during a transmit cycle.

20 Claims, 3 Drawing Sheets

U.S. PATENT DOCUMENTS

| | | |
|---|---|---|
| 2005/0204245 A1 | 9/2005 | Lee et al. |
| 2005/0243608 A1 | 11/2005 | Lee |
| 2006/0114742 A1 | 6/2006 | Salmont et al. |
| 2006/0133158 A1 | 6/2006 | Shin |
| 2006/0262613 A1 | 11/2006 | Braun et al. |
| 2007/0217559 A1 | 9/2007 | Stott et al. |
| 2009/0086562 A1 | 4/2009 | Richards |
| 2009/0244995 A1 | 10/2009 | Searles et al. |
| 2009/0244997 A1 | 10/2009 | Searles et al. |
| 2009/0245010 A1 | 10/2009 | Searles et al. |
| 2009/0296501 A1 | 12/2009 | Searles |

OTHER PUBLICATIONS

"Double Data Rate (DDR) SDRAM Specification," JESD79, Release 2, JEDEC Solid State Technology Association, JEDEC Standard, Electronics Industries Alliance, May 2002.

U.S. Appl. No. 12/059,641, Office Action mailed Apr. 1, 2010, 14 pages.
U.S. Appl. No. 12/059,593, Notice of Allowance mailed Apr. 9, 2010, 8 pages.
U.S. Appl. No. 12/059,653, Notice of Allowance mailed Apr. 29, 2010, 14 pages.
U.S. Appl. No. 12/059,641, Notice of Allowance mailed Nov. 22, 2010, 10 pages.
U.S. Appl. No. 12/059,653, Notice of Allowance mailed Aug. 10, 2010, 11 pages.
U.S. Appl. No. 12/059,641, Notice of Allowance mailed Aug. 19, 2010, 10 pages.
U.S. Appl. No. 12/059,593, Notice of Allowance mailed Jul. 22, 2010, 8 pages.
U.S. Appl. No. 12/127,059, Non-Final Office Action mailed Sep. 2, 2010, 8 pages.

* cited by examiner

CIRCUIT USING A SHARED DELAY LOCKED LOOP (DLL) AND METHOD THEREFOR

CROSS REFERENCE TO RELATED APPLICATIONS

Related subject matter is contained in the following copending applications:

Application Ser. No. 12/059,593, filed of even date herewith, entitled "CIRCUIT FOR LOCKING A DELAY LOCKED LOOP (DLL) AND METHOD THEREFOR" invented by Shawn Searles, Nicholas T. Humphries, and Faisal A. Syed and assigned to the assignee hereof.

Application Ser. No. 12/059,641, filed of even date herewith, entitled "DATA DRIVER CIRCUIT FOR A DYNAMIC RANDOM ACCESS MEMORY (DRAM) CONTROLLER OR THE LIKE AND METHOD THEREFOR" invented by Shawn Searles, Nicholas T. Humphries, and Faisal A. Syed and assigned to the assignee hereof.

Application Ser. No. 12/059,653, filed of even date herewith, entitled "METHOD FOR TRAINING DYNAMIC RANDOM ACCESS MEMORY CONTROLLER TIMING DELAYS" by Shawn Searles, Tahsin Askar, Thomas Hamilton, and Oswin Housty and assigned to the assignee hereof.

Application Ser. No. 12/127,059, filed ________, entitled "METHOD AND APPARATUS FOR IMPLEMENTING WRITE LEVELIZATION IN MEMORY SUBSYSTEMS" invented by Shawn Searles et al. and assigned to the assignee hereof.

FIELD OF THE DISCLOSURE

The invention relates generally to interface circuits, and more particularly to interface circuits that use delay locked loops (DLLs).

BACKGROUND

A data processing system includes a central processing unit (CPU) that executes instructions and thereby manipulates data. The instructions and data are stored in a memory system, which is typically isolated from the CPU. The CPU interacts with the memory system through a memory interface. The functioning of the memory interface is predominantly under the control of the CPU, and is typically performed by a memory controller. The memory controller can be integrated tightly with the CPU, such as on the same silicon chip as the CPU, or it can be included with other components of the data processing system, one such component often referred to as a north-bridge chip.

There are many types of memory. One type is referred to as dynamic random access memory (DRAM). A DRAM system can include several known types of DRAM, of which double data rate (DDR) is an example. The memory controller that governs the interface to the DRAM system may thus be referred to as a DRAM controller. Furthermore, a memory controller that interfaces a CPU to DDR DRAM may be referred to as a DDR DRAM controller.

DDR DRAM conforms to industry standard electrical and protocol standards set forth by the Joint Electron Devices Engineering Councils (JEDEC). These standards define how the contents of the DRAM are accessed (read), and stored (written). The original DDR standard has recently been enhanced to include standards known as DDR2 and DDR3. The interface to any of these DDR DRAMs is accomplished primarily through three signal classes, DQ (data), DQS (data strobe), and CMD/ADDR (command and address).

The JEDEC standard interface specifies that after issuing a read operation, the DDR DRAM will issue DQ and DQS at the same time, a manner commonly referred to as "edge aligned". In order for the DRAM controller to correctly acquire the data being sent from the DDR DRAM, the DRAM controller typically utilizes a delay-locked loop (DLL) circuit to delay the DQS signal so that it can be used to correctly latch the DQ signals. Topological and electrical difference between DQ and DQS interconnects result in timing skew between these signals, making it difficult to establish a proper delay for the DLL. For similar reasons, the DRAM controller also utilizes DLL circuits to support the writing of data to the DDR DRAM.

Unfortunately, a DLL circuit is a very expensive component of a DRAM controller. The DLL circuit is physically large, increasing cost both due to the area of silicon involved, but also due to lowering the manufacturing yield. The DLL circuit also consumes considerable electrical power, which ultimately limits system performance and increases operating cost.

BRIEF SUMMARY

In one form, a dynamic random access memory (DRAM) controller includes a read path circuit, a write path circuit, and a controller. The read path circuit has a first input for receiving a memory data signal, a second input for receiving a memory data strobe signal, and an output for providing a processor data signal. The read path circuit uses a shared delay locked loop (DLL) to receive the memory data signal. The write path circuit has a first input for receiving a processor data signal, a second input for receiving a processor clock signal, a first output for providing a memory data signal, and a second output for providing a memory data strobe signal. The write path circuit uses the shared DLL to provide one of the memory data signal and the memory clock signal. The controller enables the first DLL for use by the read path circuit during a read cycle, and enables the shared DLL for use by the write cycle path circuit during a write cycle.

In another form, a first memory data element is provided to a memory interface using a shared DLL, a second memory data element is received from the memory interface using the shared DLL, the providing is enabled during a first cycle type, and the receiving is enabled during a second cycle type.

In yet another form, a transceiver includes a receive circuit, a transmit circuit, a shared DLL, and a controller. The receive circuit has a first input coupled to an external data terminal, a second input coupled to an external data strobe terminal, and an output coupled to an internal data terminal. The transmit circuit has a first input coupled to the internal data terminal, a second input for receiving an internal clock signal, a first output coupled to the external data terminal, and a second output coupled to the external data strobe terminal. The controller enables the shared DLL for use by the receive circuit during a receive cycle and enables the shared DLL for use by the transmit circuit during a transmit cycle.

BRIEF DESCRIPTION OF THE DRAWINGS

The present disclosure may be better understood, and its numerous features and advantages made apparent to those skilled in the art by referencing the accompanying drawing, in which like reference numbers indicate similar or identical items, and in which.

DETAILED DESCRIPTION

Figure 1:
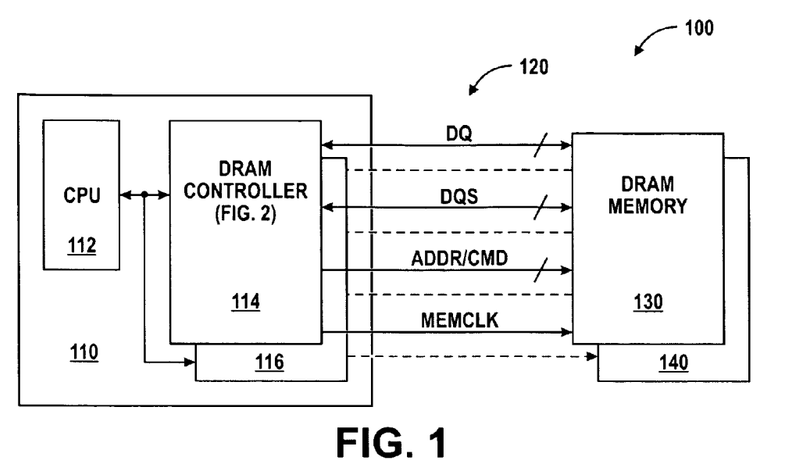
FIG. 1 illustrates in block diagram form a data processing system according to the present invention.

FIG. 1 illustrates in block diagram form a data processing system 100 according to the present invention. Data processing system 100 includes generally a microprocessor 110, a memory interface 120, and memories 130 and 140. Microprocessor 110 includes generally a central processing unit (CPU) 112, and dynamic random access memory (DRAM) controllers 114 and 116. CPU 112 has a bidirectional interface to DRAM controllers 114 and 116 for conducting address, data, and control signals. DRAM controllers 114 and 116 are also connected to memory interface 120 and each has an input/output terminal for conducting a memory data signal labeled "DQ", an input/output terminal for conducting a memory data strobe signal labeled "DQS", an output terminal for providing address and command information labeled "ADD/CMD", and an output terminal for providing a clock signal labeled "MEMCLK". Memory devices 130 and 140 are connected to microprocessor 110 via memory interface 120, and each has an input/output terminal for conducting DQ, an input/output terminal for conducting DQS, an input terminal for receiving ADD/CMD, and an input terminal for receiving MEMCLK. While the following discussion references only DRAM controller 114 and memory 130, it should be appreciated that DRAM controller 116 and memory 140 are interconnected over memory interface 120 and operate in the same way, and a data processing system can include any number of DRAM controllers and corresponding memories consistent with the principles set forth herein.

Microprocessor 110 is a single-chip data processor that includes CPU 112 as the CPU of system 100. CPU 112 executes stored program instructions and exchanges data with input output devices (not shown in FIG. 1). Note that as shown in FIG. 1, CPU 112 includes other functions such as caches, memory management units, and the like but for ease of discussion these are combined into CPU 112. Memory interface 120 is commonly referred to as the physical or PHY interface.

When CPU 112 performs a write cycle to memory 130, it provides address, control, and data signals to DRAM controller 114. DRAM controller 114 receives the request from CPU 112, and performs a write operation with memory 130 via interface 120. The memory write operation results in the memory location, indicated by the specified address, being updated with the data value supplied by CPU 112. The command portion of signal ADD/CMD informs memory 130 that a write operation is to be performed. Memory data strobe signal DQS identifies to memory 130 when data DQ is ready to be written into the memory.

When CPU 112 performs a read cycle to memory 130, it provides address and control signals to DRAM controller 114. DRAM controller 114 receives the request from CPU 112, and performs a read operation with memory 130 via interface 120. The command portion of signal ADD/CMD informs memory 130 that a read operation is to be performed. The read operation accesses memory 130 at the specified address and memory 130 responds by providing DRAM controller 114 with the requested data DQ and also provides data memory data strobe signal DQS which informs DRAM controller 114 that the requested data is available. After completing the read operation, DRAM controller 114 provides the requested data to CPU 112.

Memory 130 is implemented with double data rate (DDR) memory. Specifically, DRAM controller 114 supports either DDR2 or DDR3 memory. In other embodiments, DRAM controller 114 may easily be modified to support other versions of the DDR standard and other forms of DRAM. Moreover, DRAM controller 114 may also be modified to support other types of memory such as DDR static random access memory (SRAM), DDR flash memory, and the like.

According to the DDR standard, read and write transactions are performed in bursts, in which the address provided by signal ADD/CMD represents the first location of a series of sequential locations that will be read or that will be written to. Memory data strobe information conveyed by signal DQS is represented as a differential voltage waveform on two conductors. The command portion of signal ADD/CMD is used to request that a read or write transaction is to be performed, but is also used to initiate other types of operations including reset, refresh, and others, as described in the DDR standard.

Since memory 130 is a DDR memory, it transmits memory data strobe signal DQS during a read cycle nominally aligned with transitions of data signal DQ. During a write cycle, DRAM controller 114 transmits memory data strobe signal DQS nominally centered on the transitions of data signal DQ. Despite these requirements on the timing of DQS relative to DQ, the physical distance between memory 130 and microprocessor 110 and the relatively high speed of operation cause DQS to arrive at an arbitrary phase with respect to DQ. The use of DQS in this manner creates the need to individually delay the outgoing DQ and DQS signals during a write operation, and to delay the incoming DQS signals during a read operation. If DDR memory 130 uses memory chips organized as by-four ("x4") memories, then memory 130 requires the provision of two differential DQS signal pairs for each byte of data, because both DQS signal pairs must be individually delayed to match the characteristics of their respective chips. DRAM controller 114 also must generate a read-enable signal to synchronize the start of a read operation to avoid spuriously latching data before it is available. Generation of such a read enable signal also requires its own delay circuit.

The time delay required by each of the delay circuits must be individually determined. DRAM controller 114 performs a calibration procedure after power is initially supplied to data processing system 100 and reset is performed. DRAM controller 114 performs this calibration under the control of a basic input/output system (BIOS) prior to CPU 112 executing any application programs, to determine the appropriate delay values. DRAM controller 114 stores the individual delay values in registers, and these values in turn control the time delay provided by their corresponding delay circuits.

Forming all these delays requires a substantial amount of circuit area. DRAM controller 114 requires a total of five delays in order to support reading and writing each byte of data, two for the write path and three for the read path. Moreover, DRAM controller 114 supports a 64-bit wide bus with an additional eight bits of error correcting code (ECC). Thus DRAM controller 114 requires a total of forty-five separate delays. DRAM controller 116 requires the same number of delays, and this same number of delays would be required for each additional DRAM controller used.

Moreover DRAM controller 114 utilizes delay locked loop (DLL) circuits to provide these appropriate delays. Unfortunately, a DLL circuit is a very expensive component of a DRAM controller. The DLL circuit is physically large, increasing cost both due to the area of silicon involved, and due to lower manufacturing yield. Each DLL circuit also consumes significant electrical power, which ultimately limits system performance and increases operating cost. Especially because DRAM controller 114 requires five delays for each byte of data, the physical layout topology of a set of five DLL circuits is inefficient, resulting in even higher silicon area costs.

Figure 2:
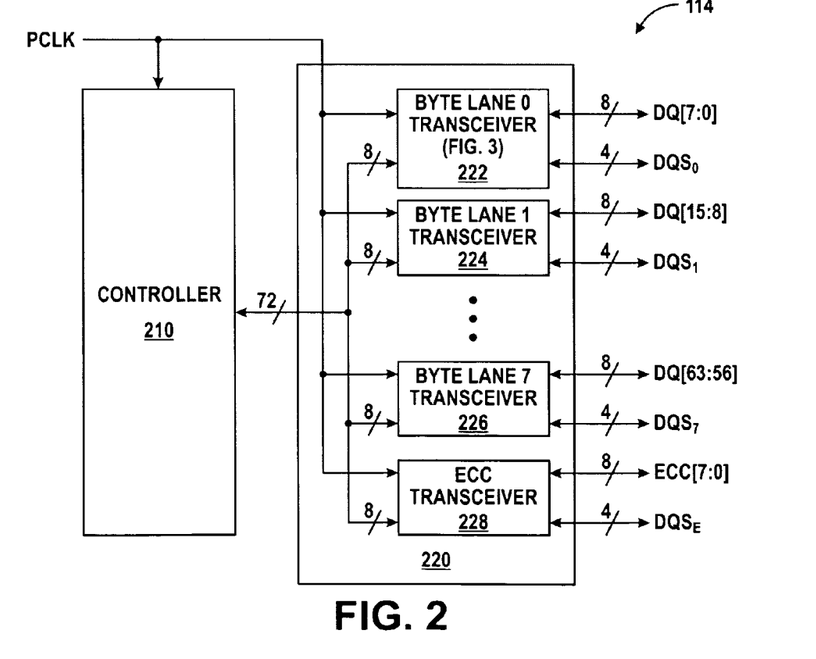
FIG. 2 illustrates in block diagram form the DRAM controller of FIG. 1.
Figure 3:
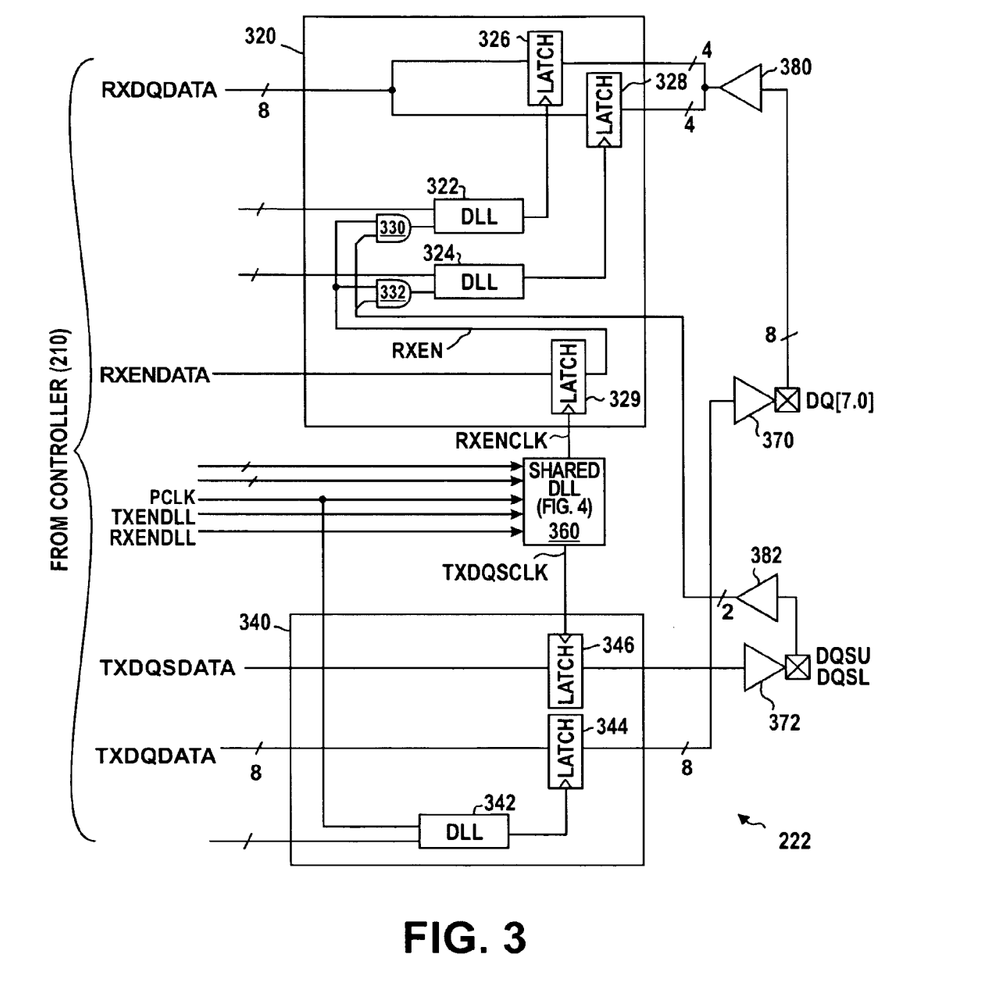
FIG. 3 illustrates in partial block diagram and partial logic diagram form a byte lane transceiver of the DRAM controller of FIG. 2.
Figure 4:
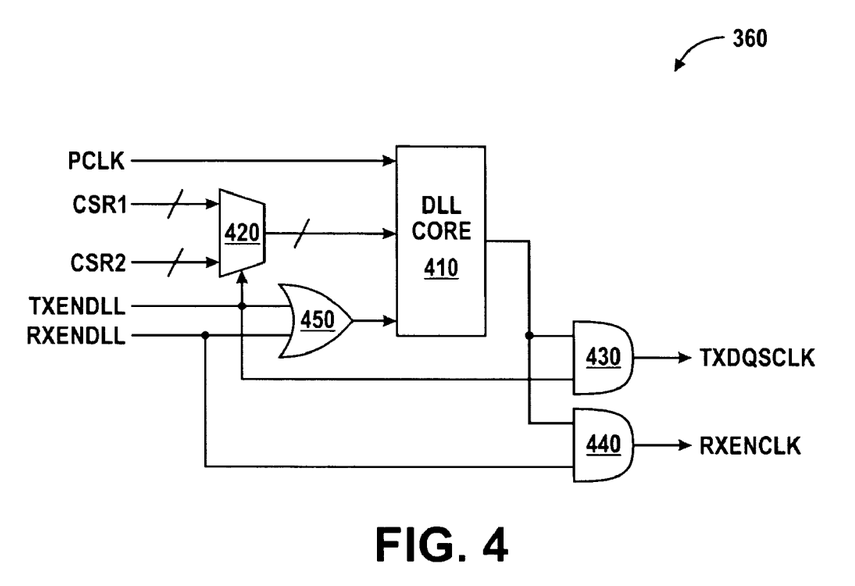
FIG. 4 illustrates in partial block diagram and partial logic diagram form the shared DLL of FIG. 3.

However DRAM controller 114 uses a shared DLL for both the read path and the write path. Thus DRAM controller 114 is more efficient in terms of circuit area than known DRAM controllers. DRAM controller 114 dynamically updates the delay value provided to the shared DLL depending on whether it is currently performing a function in the read path or the write path. FIGS. 2-4 below further illustrate additional details of the structure of DRAM controller 114 and the use and advantages of the shared DLL.

FIG. 2 illustrates in block diagram form DRAM controller 114 of FIG. 1. DRAM controller 114 generally includes a controller 210 and a transceiver 220. Controller 210 has an input for receiving a processor clock signal labeled "PCLK", a first bidirectional connection to CPU 112 (not shown in FIG. 2), and a second bidirectional connection that conducts control and data signals, including sixty-four bits of data and eight ECC bits for a total of seventy-two bits. Additional details relating to the interface between controller 210 and CPU 112 are not shown in FIG. 2.

Transceiver 220 includes eight byte-lane transceivers including representative byte-lane transceivers 222, 224, and 226, and one ECC transceiver 228. Each transceiver provides and receives eight bits of processor data through controller 210, and receives signal PCLK, and configuration data and operation commands from controller 210 (not shown in FIG. 2). Each transceiver is connected to memory interface 120 of FIG. 1 for conducting corresponding memory data and memory data strobe signals. Byte-lane transceiver 222 includes bidirectional terminals to conduct a set of memory data signals labeled "DQ[7:0]" and a set of memory data strobe signals labeled "$DQS_0$". Byte-lane transceiver 224 includes bidirectional terminals to conduct a set of memory data signals labeled "DQ[15:8]" and a set of memory data strobe signals labeled "$DQS_1$". Byte-lane transceiver 226 includes bidirectional terminals to conduct a set of memory data signals labeled "DQ[63:57]" and a set of memory data strobe signals labeled "$DQS_7$". ECC transceiver 228 includes bidirectional terminals to conduct a set of memory data signals labeled "ECC[7:0]" and a set of memory data strobe signals labeled "$DQS_E$". Each of signals $DQS_{(X)}$ are implemented as two signals: an upper-nibble signal labeled "$DQSU_{(X)}$" and a lower-nibble signal labeled "$DQSL_{(X)}$." Note that DRAM controller 114 uses signal $DQSU_{(X)}$ as an upper data strobe signal if ×4 DDR memory is selected, but as a data mask signal if ×8 or ×16 memory is selected. These signals are used within each byte-lane transceiver as single-ended signals. However during a memory write operation, these single ended signals are converted into differential signal pairs and provided to memory interface 120, and during a memory read operation, these signals are received at memory interface 120 as differential signal pairs and are converted into single-ended signals by a differential amplifier (not shown).

FIG. 3 illustrates in partial block diagram and partial logic diagram form byte-lane transceiver circuit 222 of DRAM controller 114 of FIG. 2. Byte-lane transceiver 222 includes a read path circuit 320, a write path circuit 340, a shared DLL 360, line drivers 370 and 372, and line receivers 380 and 382.

Read path circuit 320 includes an upper-nibble DLL 322, a lower-nibble DLL 324, AND gates 330 and 332, and latches 326, 328 and 329. Latch 329 has a data input for receiving a signal labeled "RXENDATA" from controller 210, a clock input for receiving a signal labeled "RXENCLK" from shared DLL 360, and an output labeled "RXEN". AND gate 330 has a first input, a second input for receiving signal RXEN, and an output. AND gate 332 has a first input, a second input for receiving signal RXEN, and an output. DLL 322 has a clock input connected to the output of AND gate 330, a second input for receiving a delay selection value from controller 210, and an output for providing a time delayed version of the upper-nibble memory data strobe signal DQSU. DLL 324 has a clock input connected to the output of AND gate 332, a second input for receiving a delay selection value from controller 210, and an output for providing a time delayed version of the lower-nibble memory data strobe signal DQSL. Latch 326 has a data input, a clock input connected to the output of DLL 322, and an output for providing four bits of an 8-bit data signal labeled "RXDQDATA" to controller 210. Latch 328 has a data input, a clock input connected to the output of DLL 324, and an output for providing the other four bits of RXDQDATA to controller 210. Latches 326 and 328 are dual-edge latches wherein input data is latched on the rising edge as well as on the falling edge of the clock signals provided by DLL 322 and 324, respectively. A multiplexer incorporated in each of latches 326 and 328 provides the appropriate latched data to the latch output terminal based upon the logic level of the input clock.

Write path circuit 340 includes a DLL 342, and latches 344 and 346. DLL 342 has a first input for receiving signal PCLK, a second input for receiving a delay selection value from controller 210, and an output. Latch 344 has a data input for receiving a signal labeled "TXDQDATA", a clock input connected to the output of DLL 342, and an output. Latch 346 has a data input for receiving a signal labeled "TXDQSDATA" from controller 210, a clock input for receiving a signal labeled "TXDQSCLK" from shared DLL 360, and an output.

Shared DLL 360 is shared and utilized by read path circuit 320 during read cycles and also by write path circuit 340 during write cycles. Shared DLL 360 has a first input for receiving a first delay selection value, a second input for receiving a second delay selection value, a third input for receiving signal PCLK, fourth and fifth inputs for respectively receiving signals labeled "TXENDLL" and "RXENDLL" from controller 210, a first output for providing signal RXENCLK, and a second output for providing signal TXDQSCLK.

Line driver 370 has an input connected to the output of latch 344 and an output for providing signal DQ[7:0] to memory interface 120. Line driver 372 has an input connected to the output of latch 346 and an output for providing the upper-nibble memory data strobe signal DQSU and the lower-nibble memory data strobe signal DQSL to memory interface 120. Line receiver 380 has an input for receiving the upper-nibble of DQ[7:0] (i.e. DQ[7:4]), and the lower-nibble of DQ[7:0] (i.e. DQ[3:0]) from memory interface 120 and an output connected to the data inputs of latches 326 and 328. Line receiver 382 has an input for receiving the differential versions of the upper-nibble memory data strobe signal DQSU and lower-nibble memory data strobe signal DQSL from memory interface 120, and an output connected to the first input of AND gate 330 for providing a single-ended upper-nibble memory data strobe and to the first input of AND gate 332 for providing a single-ended lower-nibble memory data strobe.

During a read operation, DLLs 322 and 324 delay memory data strobe signals DQSU and DQSL, respectively to capture the incoming data with adequate setup and hold time for the proper operation of latches 326 and 328. Having been successfully captured, the latched data is made available to controller 210 as RXDQDATA. During the read operation, controller 210 enables shared DLL 360 by activating signal RXENDLL while keeping signal TXENDLL inactive, and shared DLL 360 subsequently activates signal RXENCLK after a delay determined by the value received on the first input. As previously described, transceiver 222 receives differential signal versions of memory data strobe signals DQSU and DQSL, but converts them into single-ended signals for use by the byte-lane transceiver. Byte-lane transceiver 222 at FIG. 3 supports ×4 DDR memories. Read path circuit 320 would only require one of DLLs 322 and 324 to support ×8 DDR memories.

During the read operation, transceiver 222 uses DLLs 322 and 324 to appropriately delay the incoming memory data strobe signals DQSU and DQSL to capture the incoming data DQ[7:0] at the appropriate point in time. To understand why the appropriate timing is difficult to achieve, note DRAM memory 130 conforms to DDR standards that specify that the DDR memory transmit the requested data with the data transitions aligned with the transitioning of the memory data strobe signal that it also is transmitting. The memory interface operates at a data rate that can exceed 800 MHZ. This high speed causes relatively poor signal integrity of the incoming data signals, requiring latches 326 and 328 to capture them at an appropriate point in time, somewhere near the center of the incoming data transition interval. The small portion of time that all four bits of incoming data are valid and can be captured is usually referred to as the data "eye". The width of the eye represents the period of time that the data is valid and the height of the eye represents the voltage range of the valid data. Signal integrity degradation limits the width and the height of the eye.

Moreover, DDR memory may be placed on computer motherboards in any one of multiple dual inline memory module (DIMM) slots. If microprocessor 110 attempts to access a DRAM in the closest memory slot, the physical distance will cause the delay to be shorter than if microprocessor 110 attempts to access a DRAM in the farthest memory slot. In addition, different memory chips introduce variable amounts of skew between memory data signal DQ and memory data strobe signal DQS. Data processing system 100 accommodates the different skews and different distribution characteristics by training different values for the delay select signal according to which memory slot is accessed. Thus controller 210 provides the delay select values that are appropriate and are used by DLLs 322 and 324, which generate clocks for latches 326 and 328 that are centered on the eye for each DRAM.

During a write operation, write path circuit 340 and shared DLL 360 provide a suitably time-delayed version of the processor data signal DQ[7:0] and corresponding memory data strobe signals DQSU and DQSL to memory interface 120. During the write operation, controller 210 enables shared DLL 360 by activating signal TXENDLL while keeping signal RXENDLL inactive, and shared DLL 360 subsequently activates signal TXENCLK after a delay determined by the value received on its second input. Signal TXDQSCLK determines the timing of memory data strobe signals DQSU and DQSL. As previously described, transceiver 222 converts single ended signals DQSU and DQSL into differential signal pairs before being provided to interface 120.

During the write operation, byte-lane transceiver 222 provides data signal DQ[7:0] and memory data strobe signals DQSU and DQSL with a timing relationship established by DLL 342 and shared DLL 360. Controller 210 sets an appropriate timing relationship between the transmitted data and memory data strobe signals so that the memory data strobe signal transition occurs centered on the interval between data signal transitions. This timing relationship is determined through a calibration procedure performed by the BIOS after power is initially supplied to the system and reset is performed.

The DDR standard requires read and write operations to be separated by a delay equal to the period of only two DQS cycles. Shared DLL 360 transitions between support of read path circuit 320 and support of write path circuit 340 within this time period. Shared DLL 360 switches to providing the alternate one of outputs TXDQSCLK and RXENCLK. The architecture of shared DLL 360 allows rapid switching between modes so that the transition occurs within about a single DQS cycle, and this architecture will be described further with respect to FIG. 4 below.

Shared DLL 360 thus performs the functions of two individual DLLs, reducing system costs and increasing system performance. Note that in DRAM controller 114, each byte lane transceiver has a structure substantially the same as transceiver 222, and thus DRAM controller 114 uses nine fewer DLLs than what is needed to replicate the total number of unique delays. DRAM controller 116 uses shared DLLs in each byte lane transceiver in a similar fashion. Needing only four DLLs instead of five per byte lane also allows the transceivers to be laid out in a more symmetrical fashion.

FIG. 4 illustrates in partial block diagram and partial logic diagram form shared DLL 360 of FIG. 3. Shared DLL 360 includes DLL core 410, multiplexer 420, AND gates 430 and 440, and OR gate 450. DLL core 410 has a clock input for receiving signal PCLK, a delay select input, a power up control input, and an output. Multiplexer 420 has a first input for receiving a read-enable delay selection value signal labeled "CSR1", a second input for receiving a transmit DQS delay selection value signal labeled "CSR2", a third input for receiving a select signal labeled "TXENDLL", and an output connected to the second input of DLL core 410. OR gate 450 has a first input for receiving signal TXENDLL, a second input for receiving signal RXENDLL, and an output connected to the power up control input of DLL core 410. AND gate 430 has a first input connected to the output of DLL core 410, a second input for receiving signal TXENDLL, and an output for providing signal TXDQSCLK. AND gate 440 has a first input connected to the output of DLL core 410, a second input for receiving signal RXENDLL, and an output for providing signal RXENCLK.

During a read operation, signal RXENDLL is active and signal TXENDLL is inactive. Signal RXENDLL configures multiplexer 420 to provide read-enable delay selection value signal CSR1 to DLL core 410. Signal CSR1 represents a time delay value stored in a register within controller 210 and configures DLL core 410 to enable signal RXENCLK to enable latches 326 and 328 of read patch circuit 320 at the appropriate time.

During a write operation, signal TXENDLL is active and signal RXENDLL is inactive. Signal TXENDLL configures multiplexer 420 to provide transmit DQS delay selection value signal CSR2 to DLL core 410. Signal CSR2 represents a time delay value stored in a register within controller 210 and configures DLL core 410 to enable signal TXDQSCLK to enable latch 346 of write path circuit 340 at the appropriate time.

As previously described, shared DLL 360 responds to signals TXENDLL and RXENDLL, and switches from providing a delay specified by either one of signals CSR1 and CSR2 during a period of about one DQS cycle.

It should be appreciated that DLL core 410 may be implemented using any of a variety of known DLL architectures. For example, DLL core 410 can be implemented as a DLL that uses $2^N$ sequential delay stages and an N-bit delay selection signal. DLL core 410 can also be implemented as a multiplying DLL or as a recirculating DLL.

Wherein transceiver 222 shares a single DLL by both the write-path circuitry and the read-path circuitry, it should be appreciated that a second DLL can also be shared by the read path and write path circuitry. For example, whereas shared DLL 360 shares the write DQS and read enable delay functions, the second shared DLL could share the read DQS and write DQ delay functions. By extending the sharing to two DLLs, a byte-lane transceiver supporting ×4 DDR memories only requires three DLLs instead of five, and a byte-lane transceiver supporting ×8 or ×16 DDR memories (in which eight bits of data are locked to a single DQS) only requires two DLLs instead of four. It should also be appreciated that a shared DLL can replace any two DLLs that are not both required to operate at the same time.

Moreover, while FIGS. 1-4 have illustrated the use of a shared DLL in the context of a DRAM controller, such a transceiver may be advantageous in other types of circuits. For example, a transceiver with a shared DLL could be used in the DRAM itself. Since future generations of DRAMs may require increasingly sophisticated signaling techniques but will likely remain cost-sensitive, using a transceiver with a shared DLL would be especially advantageous. Other uses of the transceiver will also be readily apparent to those of ordinary skill in the art.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A dynamic random access memory (DRAM) controller comprising:
    a read path circuit having a first input for receiving a memory data signal, a second input for receiving a memory data strobe signal, and an output for providing a processor data signal, wherein said read path circuit uses a shared delay locked loop (DLL) to receive said memory data signal;
    a write path circuit having a first input for receiving said processor data signal, a second input for receiving a processor clock signal, a first output for providing said memory data signal, and a second output for providing said memory data strobe signal, wherein said write path circuit uses said shared DLL to provide one of said memory data signal and said memory data strobe signal; and
    a controller for enabling said shared DLL for use by said read path circuit during a read cycle, and for enabling said shared DLL for use by said write path circuit during a write cycle.

2. The DRAM controller of claim 1, wherein said read path circuit uses at least one additional DLL to receive said memory data signal.

3. The DRAM controller of claim 1, wherein said read path circuit uses said shared DLL to enable a latching of said memory data signal.

4. The DRAM controller of claim 1, wherein said write path circuit uses said shared DLL to provide said memory data strobe signal.

5. The DRAM controller of claim 1, comprising a plurality of transceivers, wherein a first one of said plurality of transceivers comprises said read path circuit and said write path circuit.

6. The DRAM controller of claim 1, wherein said read path circuit further uses a second shared DLL to receive said memory data signal, said write path circuit uses said second shared DLL to provide another one of said memory data signal and said memory data strobe signal, and said controller activates said second shared DLL for use by said read path circuit during said read cycle, and activates said second shared DLL for use by said write path circuit during said write cycle.

7. A method comprising:
    providing a first memory data element to a memory interface using a shared delay locked loop (DLL) in response to a memory data signal and a memory data strobe signal, wherein said read path circuit uses a shared delay locked loop (DLL) to receive said memory data signal;
    receiving a second memory data element from said memory interface using said shared DLL to provide one of said memory data signal and said memory data strobe signal, in response to a processor clock signal;
    enabling said shared DLL for use for said providing during a first cycle type; and
    enabling said shared DLL for use for said receiving during a second cycle type.

8. The method of claim 7, wherein said enabling said providing comprises enabling said providing during a write cycle, and said enabling said receiving comprises enabling said receiving during a read cycle.

9. The method of claim 7, wherein said enabling said providing comprises enabling said providing during a read cycle, and said enabling said receiving comprises enabling said receiving during a write cycle.

10. The method of claim 7, wherein said receiving comprises receiving said second memory data element from said memory interface using at least one additional DLL.

11. The method of claim 7, wherein said providing comprises providing said first memory data element to said memory interface using a second shared DLL, and said receiving comprises receiving said second memory data element from said memory interface using said second shared DLL.

12. A transceiver comprising:
    a receive circuit having a first input coupled to an external data terminal, a second input coupled to an external data strobe terminal, and an output coupled to an internal data terminal;
    a transmit circuit having a first input coupled to said internal data terminal, a second input for receiving an internal clock signal, a first output coupled to said external data terminal, and a second output coupled to said external data strobe terminal;
    a shared delay locked loop (DLL); and
    a controller for enabling said shared DLL for use by said receive circuit during a receive cycle, and for enabling said shared DLL for use by said transmit circuit during a transmit cycle.

13. The transceiver of claim 12, wherein said shared DLL further includes a control input for receiving an enable signal to enable said shared DLL during said receive cycle and said transmit cycle.

14. The transceiver of claim 13, wherein said shared DLL further includes a delay select input, and wherein the transceiver further comprises a multiplexer having a first input for receiving a first delay select value, a second input for receiving a second delay select value, a control input for receiving said select signal, and an output coupled to said delay select input of said shared DLL.

15. The transceiver of claim 12, wherein said shared DLL further includes circuitry for causing said shared DLL to enter a low power state when said enable signal indicates that neither said transmit cycle nor said receive cycle is in progress.

16. The transceiver of claim 12, wherein said receive circuit uses at least one additional DLL during said receive cycle.

17. The transceiver of claim 16, wherein said transmit circuit further uses at least one additional DLL to during said transmit cycle.

18. The transceiver of claim 12, wherein said receive circuit uses said shared DLL to enable a clocking of data received on said external data terminal.

19. The transceiver of claim 12, wherein said transmit circuit uses said shared DLL to generate a data strobe signal on said external data strobe terminal.

20. The transceiver of claim 12, wherein said receive circuit further uses a second shared DLL during said receive cycle, said transmit circuit further uses said second shared DLL during said transmit cycle, and said controller further activates said second shared DLL for use by said receive circuit during said receive cycle, and activates said second shared DLL for use by said transmit circuit during said transmit cycle.

* * * * *